US006696538B2

(12) United States Patent
Ko et al.

(10) Patent No.: US 6,696,538 B2
(45) Date of Patent: Feb. 24, 2004

(54) SEMICONDUCTOR INTERLAYER DIELECTRIC MATERIAL AND A SEMICONDUCTOR DEVICE USING THE SAME

(75) Inventors: Min-Jin Ko, Seoul (KR); Hye-Yeong Nam, Cheongju (KR); Jung-Won Kang, Seoul (KR); Myung-Sun Moon, Daejeon (KR); Dong-Seok Shin, Seoul (KR)

(73) Assignee: LG Chemical Ltd., Seoul (KR)

( * ) Notice: Subject to any disclaimer, the term of this patent is extended or adjusted under 35 U.S.C. 154(b) by 42 days.

(21) Appl. No.: 09/776,383

(22) Filed: Feb. 2, 2001

(65) Prior Publication Data

US 2001/0053840 A1 Dec. 20, 2001

Related U.S. Application Data

(60) Provisional application No. 60/179,653, filed on Feb. 2, 2000.

(51) Int. Cl.[7] .............................................. C08G 77/06
(52) U.S. Cl. ........................... 528/34; 528/37; 556/431; 556/435; 556/479
(58) Field of Search .............................. 528/34, 37, 33; 556/479, 431, 435; 428/447; 427/387; 106/287.1, 287.13

(56) References Cited

U.S. PATENT DOCUMENTS

| | | | | |
|---|---|---|---|---|
| 5,073,456 A | * | 12/1991 | Palladino ................. | 428/446 |
| 5,316,855 A | * | 5/1994 | Wang et al. ............ | 106/287.12 |
| RE34,675 E | * | 7/1994 | Plueddemann ........... | 106/287.1 |
| 5,359,112 A | * | 10/1994 | Drake ........................ | 556/479 |
| 5,548,051 A | * | 8/1996 | Michalczyk et al. ........... | 528/15 |
| 6,410,151 B1 | * | 6/2002 | Kurosawa et al. .......... | 428/447 |
| 2001/0051446 A1 | * | 12/2001 | Inoue et al. ................ | 438/780 |

FOREIGN PATENT DOCUMENTS

| | | | |
|---|---|---|---|
| JP | 07-333208 | A2 * | 12/1995 |
| JP | 11-244676 | A2 * | 9/1999 |
| JP | 2001-172573 | A2 * | 6/2001 |

OTHER PUBLICATIONS

"Direct Synthesis of Periodic Mesoporous Organosilicas: Functional Incorporation by Co–Condensation with Organosilanes", Burleigh et al., Journal of Physical Chemistry, Part B, 2001, 9935.*

* cited by examiner

*Primary Examiner*—Robert Dawson
*Assistant Examiner*—Marc S. Zimmer
(74) *Attorney, Agent, or Firm*—Knobbe Martens Olson & Bear LLP

(57) ABSTRACT

The present invention relates to low a dielectric material essential for a next generation semiconductor with high density and high performance, and more particularly to a low dielectric material that is thermally stable and has good film-forming properties and excellent mechanical properties, a dielectric film comprising the low dielectric material, and a semiconductor device manufactured using the dielectric film.

The present invention provides an organic silicate polymer having a flexible organic bridge unit in the network prepared by the resin composition of the component (a) and the component (b).

a) organosilane of the formula $R^1_m R^2_n SiX_{4-m-n}$ (where each of $R^1$ and $R^2$ which may be the same or different, is a non-hydrolysable group; X is a hydrolysable group; and m and n are integers of from 0 to 3 satisfying $0 \leq m+n \leq 3$) and/or a partially hydrolyzed condensate thereof b) organic bridged silane of the formula $R^3_p Y_{3-p} Si$—M—$SiR^4_q Z_{3-q}$ (where each of $R^3$ and $R^4$ which may be the same or different, is a non-hydrolysable group; each of Y and Z which may be the same or different, is a hydrolysable group; and p and q are integers of from 0 to 2) and/or a cyclic oligomer with organic bridge unit (Si—M—Si).

7 Claims, No Drawings

SEMICONDUCTOR INTERLAYER DIELECTRIC MATERIAL AND A SEMICONDUCTOR DEVICE USING THE SAME

RELATED APPLICATION

This application claim the benefit of earlier filing date of the U.S. Provisional Application No. 60/179,653, filed Feb. 2, 2000.

BACKGROUND OF THE INVENTION

Field of the Invention (a) The present invention relates to a low dielectric material essential for a next generation semiconductor device with high density and high performance, and more particularly to a low dielectric material that is thermally stable and has good film-forming properties and excellent mechanical properties, a dielectric film comprising the same, and a semiconductor device manufactured from the dielectric film.

(b) Description of the Related Art

The semiconductor industry is moving toward increasing device complexity, requiring shrinking geometric dimensions and higher component integration with greater dimensional densities in integrated circuit devices, e.g. memory and logic chips. This has led to an increase in the number of wiring levels and a reduction in the wiring pitch to increase the wiring density. Current leading-edge logic processors have 6–7 levels of high density interconnect, and interconnect line width is scheduled to decrease to 0.1 µm around the year 2005.

As device dimensions shrink to less than 0.25 µm, the propagation delay, crosstalk noise, and power dissipation due to resistance-capacitance (RC) coupling become significant. The smaller line dimension increases the resistivity of metal wires, and the narrow intermetal spacing increases the capacitance between the metal wires. Thus although the speed of the device will increase as the feature size decreases, the interconnect delay becomes the major fraction of the total delay and limits the overall chip performance. Accordingly, in order to prepare a chip having high speed, a conductor having a low resistance and a dielectric material having low dielectric constant should be used. In addition, the use of low dielectric material can remarkably decrease the power dissipation and crosstalk noise.

Recently, several semiconductor device manufacturers have put test products on the market that show improvement in their performance of 20% or more, using copper wiring with high electric conductivity instead of using the conventional aluminum wiring. Recently they shift to use of new materials that exhibit low dielectric constant performance, for use in interconnects. If the dielectric films between interconnect layers in integrated circuit can make use of these materials, the effect on operating speed will be the same as that which resulted with the switch from aluminum to copper technology. For instance, if the dielectric constant of the dielectric material is changed from 4.0 to about 2.5, IC operating speed will be improved by about 20%.

The interlayer dielectric material used in semiconductor integrated circuit devices is predominantly $SiO_2$, which is generally formed using chemical vapor deposition (CVD) or plasma enhanced techniques and has the requisite mechanical and thermal properties to withstand various processing operations associated with semiconductor manufacturing. The relative dielectric constant of a $SiO_2$ material varies with the conditions under which a dielectric is formed; that of silicon thermal oxidation films, which have the lowest dielectric constant, is on the order of 4.0. Attempts have been made to reduce the dielectric constant by introducing fluorine atoms into an inorganic film deposited by CVD. However, the introduction of fluorine atoms in large amounts decreases the chemical and thermal stability, so the dielectric constant achieved in actual practice is on the order of 3.5. Fluorinated oxides can provide an immediate near-term solution and a shift to new types of insulating materials with sub-3 dielectric constant may be required.

One class of candidates is organic polymers, some of which have a dielectric constant of less than 3.0. Incorporating fluorine into such organic polymer is known to further lower the dielectric constant. Most organic polymers do not, however, possess the physico-chemical properties required for on-chip semiconductor insulation, particularly thermal stability and mechanical properties (sufficient to withstand back end of the line fabrication temperatures within the range of 400~450° C.). Few organic polymers are stable at temperatures greater than 450° C. They also have a low glass transition temperature and thus elasticity thereof remarkably decreases at high temperature, and they have a very high linear expansion coefficient. Since temperature rises to up to 450° C. during semiconductor IC integration and packaging processes, the resulting low thermal stability and elasticity and high linear expansion coefficient can deteriorate the reliability of the device.

Recently in order to solve thermal stability problems of organic polymers, the development of organic silicate polymers using a sol-gel process has emerged. In particular, organic SOG(Spin On Glass) has been proposed for use as interlayer dielectrics in which the side chain of an organic component (an alkyl group such as methyl) is bonded to the backbond chain of a siloxane bond. While having a lower dielectric constant, e.g., the range of about 2.7~3.2, than conventional glasses, such materials typically have poor mechanical properties. For instance methylsilsesquioxnane polymer experiences crack formation during processing unless the film is very thin (often <1 µm)

Miller et al. have reported a method of toughening the silsesquioxane material systems by incorporating a small amount of polymeric substituents such as a polyimide. A method of mixing an inorganic fine particulate powder is also known as another method for improving the mechanical properties of organosilicates. Although various systems have been proposed, there remains a need for a material having a suitable low dielectric constant and appropriate physico-chemical properties for use as an interlayer dielectric in the future generation of IC devices.

SUMMARY OF THE INVENTION

The present invention is made in consideration of the problems of the prior art, and it is an object of the present invention to provide a dielectric material that can make the speed of a semiconductor device high, decrease power consumption thereof, and reduce crosstalk between metal wiring.

It is another object of the present invention to provide an organic silicate polymer having improved crack resistance and mechanical strength, a dielectric film prepared using the organic silicate polymer, a semiconductor device comprising the dielectric film, and processes for preparing them.

In order to achieve these objects, the present invention provides an organic silicate polymer having a flexible organic bridge unit in the network prepared by the resin composition of the component (a) and the component (b).

(a) organosilane of the formula $R^1{}_mR^2{}_nSiX_{4-m-n}$ (where each of $R^1$ and $R^2$ which may be the same or different, is a non-hydrolysable group; X is a hydrolysable group; and m and n are integers of from 0 to 3 satisfying $0 \leq m+n \leq 3$) and/or a partially hydrolyzed condensate thereof (b) organic bridged silane of the formula $R^3{}_pY_{3-p}Si-M-SiR^4{}_qZ_{3-q}$ (where each of $R^3$ and $R^4$ which may be the same or different, is a non-hydrolysable group; each of Y and Z which may be the same or different, is a hydrolysable group; and p and q are integers of from 0 to 2) and/or a cyclic oligomer with organic bridge unit (Si—M—Si).

DETAILED DESCRIPTION AND THE PREFERRED EMBODIMENT

The present invention provides a low dielectric resin composition useful as e.g. a resin composition capable of forming a uniform dielectric film by overcoming a drawback such that it is mechanically brittle, while maintaining mechanical hardness and excellent electrical properties of a resin having a low dielectric constant.

The present invention provides a low dielectric resin composition comprising the following components (a) and (b), and a process for its production. A dielectric film formed by the resin composition of the present invention is a film having a dielectric constant at most 3.3, preferably less than 3.0, wherein a cured product prepared by the component (a) and component (b) are uniformly cross-linked by a chemical reaction:

(a) organosilane of the formula $R^1{}_mR^2{}_nSiX_{4-m-n}$ (where each of $R^1$ and $R^2$ which may be the same or different, is a non-hydrolysable group; X is a hydrolysable group; and m and n are integers of from 0 to 3 satisfying $0 \leq m+n \leq 3$) and/or a partially hydrolyzed condensate thereof (b) organic bridged silane of the formula $R^3{}_pY_{3-p}Si-M-SiR^4{}_qZ_{3-q}$ (where each of $R^3$ and $R^4$ which may be the same or different, is a non-hydrolysable group; each of Y and Z which may be the same or different, is an hydrolysable group; and p and q are integers of from 0 to 2) and/or a cyclic oligomer with organic bridge unit (Si—M—Si).

As the component (a) organosilane of the formula $R^1{}_mR^2{}_nSiX_{4-m-n}$, each of $R^1$ and $R^2$ is independently hydrogen, alkyl such as methyl, ethyl or others, fluorine-containing alkyl group such as trifluoromethyl or trifluoropropyl, or aryl such as phenyl, X is independently hydrolysable group, halide such as chlorine, alkoxy such as methoxy, ethoxy or propoxy, acyloxy such as acetoxy, or others. Some examples of the component (a) organosilane include tetraalkoxysilane, mono-alkyltrialkoxysilane, dialkylalkoxysilane, tetrachlorosilane, monoalkyltrichlorosilane, dialkyldichlorosilane, a mixture thereof etc. The partially hydrolyzed product of the organosilane monomer can be obtained by allowing a monomer or an oligomer to react in an organic solvent after addition of water and a catalyst at a temperature not higher than the boiling point of the organic solvent for a state time.

As the component (b) organic bridged silane of the formula $R^3{}_pY_{3-p}Si-M-SiR^4{}_qZ_{3-q}$, each of $R^3$ and $R^4$ is independently hydrogen, alkyl, such as methyl, ethyl or others, fluorine-containing alky group such as trifluoromethyl or trifluoropropyl, alkenyl such as vinyl or allyl, or aryl such as phenyl, Y and Z are independently hydrolysable group, halide such as chlorine, alkoxy such as methoxy, ethoxy or propoxy, acyloxy such as acetoxy, or others. When $R^3$ and/or $R^4$ are alkenyl, it may be further bridged by a method of hydrosilylation reaction described below. Organic bridge unit, M, may be alkylene or arylene, preferably ethylene or propylene Synthesis of the organic bridged silane is afforded from hydrosilylation reaction, i.e. an addition reaction between a silane monomer containing a Si—H group with a silane monomer containing aliphatic unsaturated carbon(—CH=$CH_2$) in presence of a catalyst or free radical initiator. Preferred catalysts in the present invention are the platinum group metal containing catalysts. They can be any of those known in the art to effect a hydrosilylation reaction between a silicon-bonded hydrogen atom and an unsaturated carbon-carbon bond, e.g. platinum, palladium, osmium, iridium, and ruthenium etc. A transition metal catalyst such as platinum, or a free radical initiator is employed in an effective amount, depending on the particular catalyst used.

Cyclic oligomer with organic bridge (Si—M—Si) unit can be synthesized by the hydrosilylation reaction of a oligomer of ring structure (I) and/or ring structure (II), i.e. an addition reaction between a silane monomer containing a Si—H group with a cyclic oligomer (I) and/or(II) containing aliphatic unsaturated carbon (—CH=$CH_2$) in presence of a catalyst or free radical initiator,

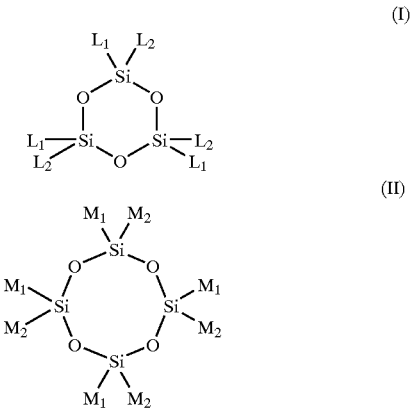

where $L_1$ is alkenyl such as vinyl or allyl, $L_2$ is hydrogen, alkyl such as methyl, ethyl or others, or aryl such as phenyl, $M_1$ is alkenyl such as vinyl or allyl, $M_2$ is hydrogen, alkyl such as methyl, ethyl or others, or aryl such as phenyl.

The cross-linking reaction between the component (a) and the component (b) may take place in the state of the solution or during the state of forming the coating film. However, it is preferred that the crosslinking reactions partially take place in the state of the solution to form a uniformly distributed random copolymer. The partially hydrolyzed copolymer product can be obtained by allowing a component (a) and a component (b) to react in an organic solvent after addition of water and catalyst.

The compositional proportion of the resin (b) can be set at optional levels depending upon the particular purpose. Usually it is preferred to mix the organic bridged silane (b) in an amount of more than 5 parts by weight, preferably more than 10 parts, per 100 parts by weight of the resin (a). If the proportion of the organic bridged silane content is too small, the mechanical properties may not be adequately improved.

Solvents which may be used include any agent or mixture of agents which will dissolve the composition to form a homogeneous liquid mixture of component (a) and (b).

These solvents include alcohols such as methyl alcohol, ethyl alcohol or isopropyl alcohol, aromatic hydrocarbon such as benzene or toluene, ketones such as acetyl acetone, methyl isobutyl ketone or methyl ethyl ketone, ethers or esters, and others.

As the catalyst, an acid or an alkali may be used. The acid may include hydrochloric acid, sulfuric acid, phosphoric acid, nitric acid, formic acid, propionic acid, butyric acid, oxalic acid or acetic acid, succinic acid, or others. The alkali may include ammonia, methylamine, ethylamine, sodium hydroxide, potassium hydroxide, or others.

There are no particular limitations on the reaction temperature when the product is made to have a high molecular weight. The temperature may preferably be not higher than the boiling point of the organic solvent used, and may preferably be 0° C. to 80° C. in order to control the molecular weight of the resultant hydrolyzed product. There are no particular limitations on the reaction time at the time of hydrolysis, and the reaction may be completed at the time the product reaches a stated molecular weight. It is usually preferred to set the molecular weight of the product within a range of from 500 to 100,000 as a weight average molecular weight. If the molecular weight of a hydrolyzed co-condensate of the component (a) and (b) is less than 500, it may be difficult to form a uniform coating film, and if the molecular weight of a hydrolyzed co-condensate is greater than 100,000, co-condensate polymer may become insoluble. The solid content concentration in the solution, as the sum of the resin component (a) and resin component (b), may suitable be selected from the viewpoint of the desired viscosity of the solution or the film thickness of the coating film, within the range where the solid content dissolves.

As a method for forming a coating film on a substrate, it is preferred to employ a method wherein the composition of the present invention containing a solvent is coated on the substrate, followed by heating and drying to evaporated solvent. Here the resin composition is applied to a substrate by methods known in the art such as spin coating, dip coating, spray coating, flow coating, screen printing or others. The coating method may suitably be selected depending on the shape of the substrate to be coated, the required film thickness, etc. When the composition of the present invention is to be applied to an interlayer dielectric film for a semiconductor device, a spin coating method is preferred, since the in-plane distribution of the film thickness will thereby be uniform. The solid content concentration in the solution, as the sum of the resin composition of (a) and (b) may suitably be selected from the viewpoint of the desired viscosity of the solution or the thickness of the coating film, within the range where the solid content dissolves.

To form a coating film, a curing step is required after coating, to evaporate the solvent and further to crosslink the partially hydrolyzed co-condensate of mixture of the resin component (a) and (b). The heating may be conducted as a single-step process or a step-wise process. For a sufficient cure the partially hydrolyzed co-condensate of the mixture of resin composition (a) and (b) and to ensure that unreacted alkoxysilyl groups or silanol groups will not remain, a final curing at temperature of preferably from 300 to 500° C., more preferably for 400 to 500° C., is required. Unreacted alkoxysilyl groups or silanol groups will be a factor for increasing the dielectric constant of the coating film by themselves, and they may further be a water absorbing site, which causes an increase of the dielectric constant by water. Accordingly, it is desirable not to let them remain in the coating film.

The coating produced by the method herein are on any substrate such as a metal or a ceramic but particularly useful on an electronic substrates intended for use in manufacture of an electronic device; an integrated circuit(IC) device, such as memory IC, logic IC or MMIC(monolithic microwave IC); a hybrid IC; a optical device, such as a light emitting diode or a charge coupled device; display device such as a liquid crystal display device and the like.

The coating film formed by the composition of the present invention is applied as a buffer coating film, a passivation film, or an interlayer dielectric film for a electronic device, whereby it is possible to attain high performance in e.g. reducing the time of signal propagation delay of a device by virtue of excellent electrical properties such as a low dielectric constant and a high dielectric strength, and it is also possible to attain high reliability by virtue of excellent mechanical properties. The resin composition of the present invention may be useful as a matrix resin composition for preparing porous dielectric films. For instance a mixture of the resin composition of the present invention and thermally labile polymers or organic small molecules may be spin-coated and thermally cured to initiate vitrification and decomposition of the labile polymers or small molecules.

Now, the following examples are provided to illustrate the present invention. The detailed preparations fall within the scope of, and serve to exemplify, the more generally described methods set forth above. These examples are presented for illustrative purposes only, and should not used to limit the scope of this invention found in the claims.

EXAMPLE 1

10 µl of 0.1 M platinum catalyst and 1.74 ml of vinyltrimethoxysilane were mixed and reacted in a completely dried reaction container at room temperature for approximately 15 minutes, and then 2.3 ml of trimethoxysilane was introduced therein and reaction was continued at 50° C. for 15 hours under a nitrogen atmosphere. Remaining reactants were completely removed under vacuum, and the completion of the hydrosilylation reaction was confirmed with a NMR spectrum.

6 ml of methyltrimethoxysilane and 1.06 ml of the hydrosilylation reaction product(bistrimethoxysilylethane) were mixed in another container with 15 ml of tetrahydrofuran solvent, and the temperature thereof was lowered to 5° C. under a nitrogen atmosphere. To the mixed solution, 0.7 ml of 2 N hydrochloric acid diluted with 1.2 ml of distilled water were slowly added thereto while stirring. After reaction at 70° C. for overnight, the solution was cooled to room temperature, and then it was diluted with toluene and washed with distilled water until the pH thereof became neutral. Magnesium sulfate was introduced into the obtained organic layer to completely remove remaining water therein, and the organic solvent was completely removed from the obtained organic layer in a vacuum oven.

300 mg of the obtained powder were dissolved in methylisobutylketone such that the total solution amounted to 1.5 g. The obtained solution was filtered to remove impurities therefrom, spin-coated to obtain a thin film, and cured under a nitrogen atmosphere at 430° C. for 1 hour to prepare a dielectric film.

EXAMPLE 2

10 μl of 0.1 M platinum catalyst and 1.0 ml of 2,4,6,8-tetravinyl-2,4,6,8-tetramethyl siloxane were mixed and reacted in a completely dried reaction container at a room temperature for approximately 15 minutes, and then 3.15 ml of triethoxysilane were introduced therein and reaction was continued at 50° C. for 15 hours under a nitrogen atmosphere. Remaining reactants were completely removed under vacuum, and the completion of the reaction was confirmed with a NMR spectrum.

40 ml of tetrahydrofuran and 19 ml of methyltrimethoxy silane were mixed in another container and the temperature thereof was lowered to 5° C. under a nitrogen atmosphere. To the mixture solution, 10.24 ml of distilled water and 2.1 ml of 2.0 N hydrochloric acid were slowly added thereto while stirring. Then, the 2.1 ml of the hydrosilylation product was again slowly added. After reaction at 70° C. for overnight, the solution was cooled to room temperature, and then it was diluted with toluene and washed with water until the pH became neutral. Magnesium sulfate was introduced into the obtained organic layer to completely remove remaining water therein, and the organic solvent was completely removed from the obtained organic layer in a vacuum oven.

The obtained powder was dried and cured to prepare a dielectric film by the same method as in Example 1.

[Comparative Example 1]

7.6 ml of methytrimethoxysilane, 4.05 ml of distilled water and 10 ml of tetrahydrofuran were mixed at room temperature, and then 0.8 ml of 2 N hydrochloric acid was slowly added to the mixture while stirring. After reaction at 70° C. for overnight, the solution was cooled to room temperature, and then it was diluted with toluene and washed with water until the pH became neutral. Magnesium sulfate was introduced into the obtained organic layer to completely remove remaining water therein, and the organic solvent was completely removed from the obtained organic layer in a vacuum oven.

The obtained powder was dried and cured to prepare a dielectric film by the same method as in Example 1.

Fracture properties of the films were measured using a microvicker indenter, which can produce small cracks emanating from the indentation corners. The crack propagation of the films prepared by the methods as in Examples 1 and 2 proceeded with a velocity in the range of $10^{-10} \sim 10^{-12}$ m/s. Methylsilsesquioxane films of the same thickness prepared by the method as in Comparative Example 1 at a velocity in the range of $10^{-7} \sim 10^{-9}$ m/s. Mechanical Young's Modulus was measured using a nanoindenter. Young's moduli of the films prepared by the methods as in Examples 1 and 2 were in the range of 3.5~6.0 GPa, while methylsilsesquioxane films in Comparative Example 1 in the range of 2.5~3.5 GPa.

The present invention solves the defects of the prior art that conventional organic silicate film has low crack resistance and mechanical strength, by preparing an organic silicate polymer having a flexible organic bridge unit in the network. Although this invention has been described with respect to specific embodiments, the details thereof are not be constructed as limitations for it will be apparent that various embodiments, changes, and modifications may be resorted to without departing from the spirit and scope thereof, and it is understood that such equivalent embodiments are intended to be included within the scope of this invention.

What is claimed is:

1. A process for preparing an organic silicate polymer having a flexible bridge unit in the network comprising the step of:

reacting the following component (a) with the following component (b) in an organic solvent after addition of water and catalyst:

(a) organosilane of the formula $R^1{}_m R^2{}_n SiX_{4-m-n}$ (where each of $R^1$ and $R^2$ which may be the same or different, is a non-hydrolysable group selected from hydrogen, alkyl, fluorine-containing alkyl or aryl group; X is a hydrolysable group selected from halide, alkoxy or acyloxy; and m and n are integers of from 0 to 3 satisfying $0 \leq m+n \leq 3$) or a partially hydrolyzed condensate thereof; and (b) organic bridged silane of the formula $R^3{}_p Y_{3-p} Si—M—SiR^4{}_q Z_{3-q}$ (where each of $R^1$ and $R^4$ which may be the same or different, is a non-hydrolysable group selected from hydrogen, alkyl, fluorine-containing alkyl, alkenyl or aryl; each of Y and Z which may be the same or different, is a hydrolysable group selected from halide, alkoxy or acyloxy; M is alkylene or arylene group; and p and q are integers of from 0 to 2) or a cyclic oligomer with organic bridge unit (Si—M—Si), wherein the organic bridged silane is synthesized by reacting a silane monomer containing a Si—H with a silane monomer containing aliphatic unsaturated carbon (—CH═CH₂) in the presence of a catalyst.

2. The process according to claim 1 wherein the organic silicate polymer has a weight average molecular weight of from 500 to 100,000.

3. The process according to claim 1, wherein the partially hydrolyzed condensate of the organosilane is obtained by reacting the organosilane of the formula $R^1{}_m R^2{}_n SiX_{4-m-n}$ with water in an organic solvent in the presence of a catalyst.

4. The process according to claim 1, wherein the cyclic oligomer with organic bridge unit (Si—M—Si) is synthesized by the hydrosilylation reaction of an oligomer of ring structure (I):

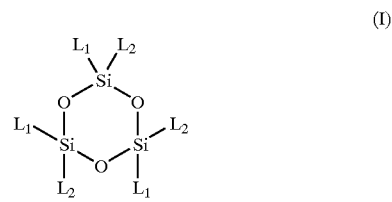

(I)

wherein $L_1$ is alkenyl; and $L_2$ is selected from the group consisting of hydrogen, alkyl, and aryl.

5. The process according to claim 1, wherein the cyclic oligomer with organic bridge unit (Si—M—Si) is synthesized by the hydrosilylation reaction of an oligomer of ring structure (II):

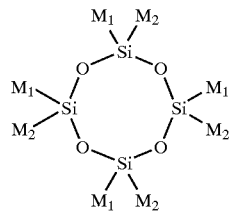

(II)

wherein $M_1$ is alkenyl; and $M_2$ is selected from the group consisting of hydrogen, alkyl, and aryl.

6. The process according to claim 1, wherein the cyclic oligomer with organic bridge unit (Si—M—Si) is synthesized by the hydrosilylation reaction of an oligomer of ring structure (I) and an oligomer of ring structure (II):

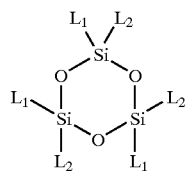

(I)

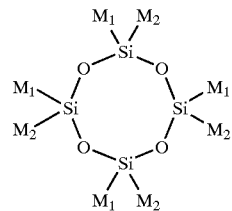

(II)

wherein $L_1$ is alkenyl; $L_2$ is selected from the group consisting of hydrogen, alkyl, and aryl; $M_1$ is alkenyl; and $M_2$ is selected from the group consisting of hydrogen, alkyl, and aryl.

7. The process according to claim 1, wherein an amount of the organic bridged silane reacted with component (a) is greater than 5 parts by weight per 100 parts by weight of component (a).

* * * * *